United States Patent
Chen et al.

(10) Patent No.: US 10,600,709 B2
(45) Date of Patent: Mar. 24, 2020

(54) BUMP-ON-TRACE PACKAGING STRUCTURE AND METHOD FOR FORMING THE SAME

(71) Applicant: Taiwan Semiconductor Manufacturing Company, Ltd., Hsinchu (TW)

(72) Inventors: Meng-Tse Chen, Changzhi Township (TW); Wei-Hung Lin, Xinfeng Township (TW); Chih-Wei Lin, Zhubei (TW); Kuei-Wei Huang, Hsinchu (TW); Hui-Min Huang, Taoyuan (TW); Ming-Da Cheng, Jhubei (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/050,669

(22) Filed: Jul. 31, 2018

(65) Prior Publication Data
US 2018/0337106 A1 Nov. 22, 2018

Related U.S. Application Data

(62) Division of application No. 13/544,783, filed on Jul. 9, 2012, now Pat. No. 10,192,804.

(51) Int. Cl.
*H01L 21/00* (2006.01)
*H01L 23/31* (2006.01)
(Continued)

(52) U.S. Cl.
CPC .... *H01L 23/3157* (2013.01); *H01L 23/49816* (2013.01); *H01L 24/13* (2013.01); *H01L 24/16* (2013.01); *H01L 24/81* (2013.01); *H01L 2224/10175* (2013.01); *H01L 2224/1146* (2013.01); *H01L 2224/11849* (2013.01); *H01L 2224/13082* (2013.01); *H01L 2224/13111* (2013.01); *H01L 2224/13147* (2013.01); *H01L 2224/16238* (2013.01);
(Continued)

(58) Field of Classification Search
CPC . H01L 2224/32145; H01L 2924/32145; H01L 2224/16145; H01L 2924/12042; H01L 2224/97; H01L 25/0657; H01L 2224/48145; H01L 2225/06513
USPC ................................ 438/107, 108, 109, 110
See application file for complete search history.

(56) References Cited

U.S. PATENT DOCUMENTS 4,908,096 A 3/1990 Zupancic
7,642,135 B2 1/2010 Liang
(Continued)

*Primary Examiner* — S. V. Clark
(74) *Attorney, Agent, or Firm* — Slater Matsil, LLP

(57) ABSTRACT

A device comprises a first package component, and a first metal trace and a second metal trace on a top surface of the first package component. The device further includes a dielectric mask layer covering the top surface of the first package component, the first metal trace and the second metal trace, wherein the dielectric mask layer has an opening therein exposing the first metal trace. The device also includes a second package component and an interconnect formed on the second package component, the interconnect having a metal bump and a solder bump formed on the metal bump, wherein the solder bump contacts the first metal trace in the opening of the dielectric mask layer.

20 Claims, 3 Drawing Sheets

(51) Int. Cl.
 *H01L 23/00* (2006.01)
 *H01L 23/498* (2006.01)

(52) U.S. Cl.
 CPC .............. *H01L 2224/73204* (2013.01); *H01L 2224/81191* (2013.01); *H01L 2224/81385* (2013.01); *H01L 2224/81815* (2013.01); *H01L 2924/12042* (2013.01); *H01L 2924/15311* (2013.01)

(56) References Cited

U.S. PATENT DOCUMENTS

| | | | |
|---|---|---|---|
| 8,513,796 B2* | 8/2013 | Tseng | H01L 23/4334 |
| | | | 257/686 |
| 8,669,137 B2 | 3/2014 | Nah et al. | |
| 2002/0034872 A1 | 3/2002 | Kazama et al. | |
| 2003/0218250 A1 | 11/2003 | Kung et al. | |
| 2005/0275096 A1 | 12/2005 | Zeng et al. | |
| 2009/0091027 A1 | 4/2009 | Fan | |
| 2009/0250811 A1 | 10/2009 | Pendse | |
| 2010/0025833 A1* | 2/2010 | Pagaila | H01L 21/561 |
| | | | 257/686 |
| 2011/0241193 A1 | 10/2011 | Ding et al. | |
| 2012/0006592 A1 | 1/2012 | Ouchi et al. | |
| 2013/0140694 A1* | 6/2013 | Lin | H01L 23/49838 |
| | | | 257/737 |
| 2015/0380391 A1* | 12/2015 | Ha Woo | H05K 3/0017 |
| | | | 257/686 |
| 2016/0181231 A1* | 6/2016 | Lin | H01L 21/565 |
| | | | 257/686 |
| 2016/0197063 A1* | 7/2016 | Lin | H01L 24/97 |
| | | | 257/686 |

* cited by examiner

BUMP-ON-TRACE PACKAGING STRUCTURE AND METHOD FOR FORMING THE SAME

CROSS-REFERENCE TO RELATED APPLICATIONS

This application is a divisional of U.S. application Ser. No. 13/544,783, filed on Jul. 9, 2012, which application is hereby incorporated herein by reference.

BACKGROUND

Bump-on-Trace (BOT) structures are used in flip chip packages, where metal bumps are bonded onto metal traces in package substrates directly, rather than bonded onto metal pads in conventional package bonding schemes. The BOT structures facilitate smaller chip areas, and the manufacturing cost of the BOT structures is lower compared to conventional package bonding schemes. The BOT structures achieve substantially the same reliability as the conventional bond structures that are based on metal pads.

When using a BOT structure, the metal bumps are soldered onto the metal traces on the package substrate by a reflow process. However, the metal bumps are typically wider than the metal traces, and hence the solder bonding the metal bumps to the metal traces may shift. Several problems may result from the metal bump shift. For example, solder bumps may crack, or may bridge to neighboring metal traces, especially at the minimum bump to trace location causing device failure. Further, the solder bumps may shift and bridge to neighboring metal traces due to the coefficient of thermal expansion (CTE) mismatch between the package substrate and the chip.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
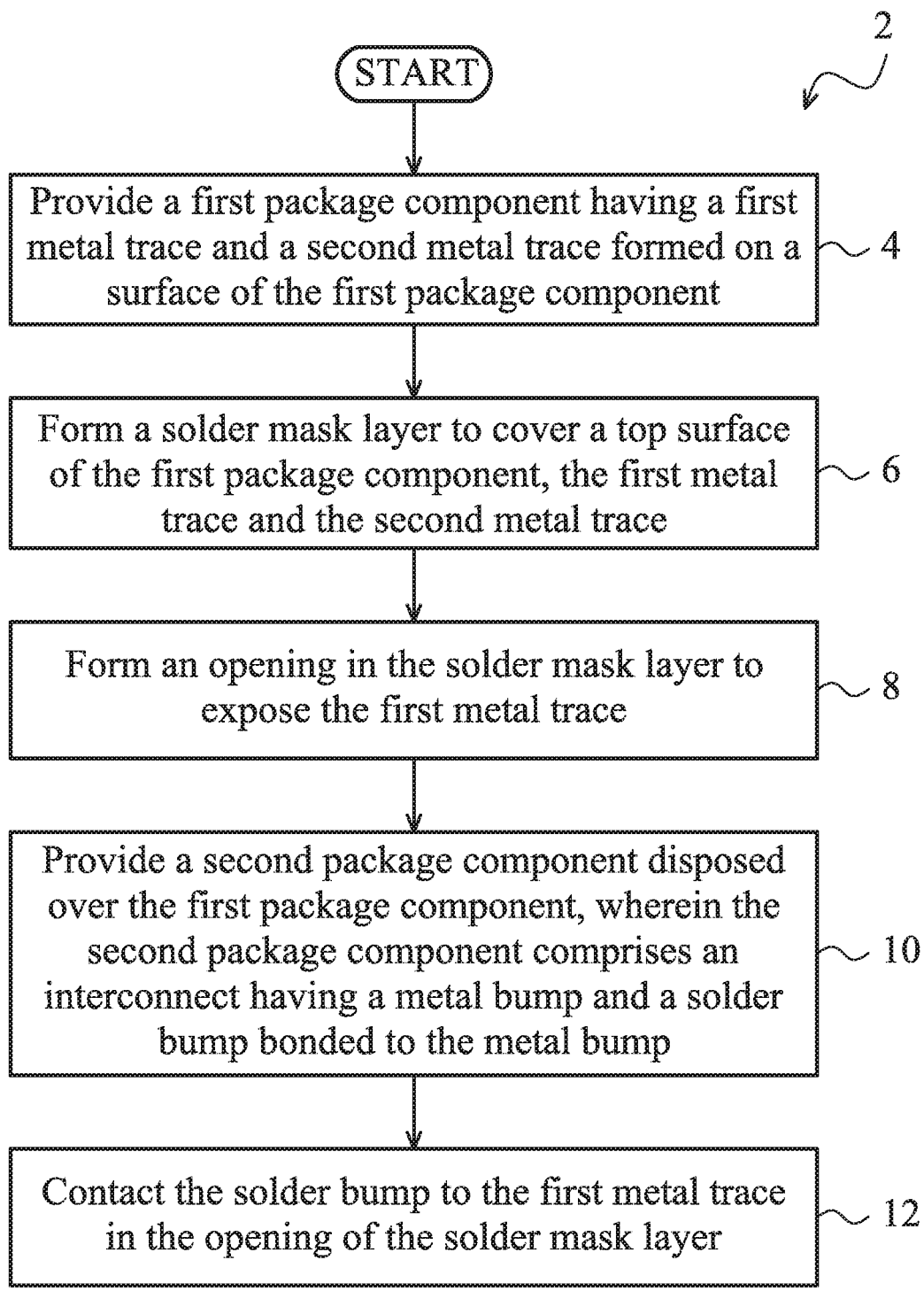
FIG. 1 is a flowchart of a method of fabricating a bump-on-trace structure according to various embodiments of the present disclosure.

FIG. 1 is a flowchart of a method 2 for fabricating a bump-on-trace structure according to various aspects of the present disclosure. Referring to FIG. 1, the method 2 includes block 4, in which a first package component is provided. The first package component has a first metal trace and a second metal trace formed on a surface of the first package component. The method 2 includes block 6, in which a solder mask layer is formed over the first package component to cover a top surface thereof, the first metal trace, and the second metal trace. The method 2 includes block 8, in which an opening is formed in the solder mask layer to expose the first metal trace. The method 2 includes block 10, in which a second package component is provided. The second package component is disposed over the first package component, the second package component comprising an interconnect having a metal bump and a solder bump bonded to the metal bump. The method 2 includes block 12, in which the solder bump is contacted to the first metal trace in the opening of the solder mask layer.

It is understood that additional processes may be performed before, during, or after the blocks 4-12 shown in FIG. 1 to complete the fabrication of the bump-on-trace structure, but these additional processes are not discussed herein in detail for the sake of simplicity.

FIGS. 2-5 are cross-sectional side views of a portion of a bump-on-trace package structure at various stages of fabrication in accordance with various embodiments of the method 2 of FIG. 1. One of ordinary skill would understand that FIGS. 2-5 have been simplified for a better understanding of the inventive concepts of the present disclosure.

Figure 2:
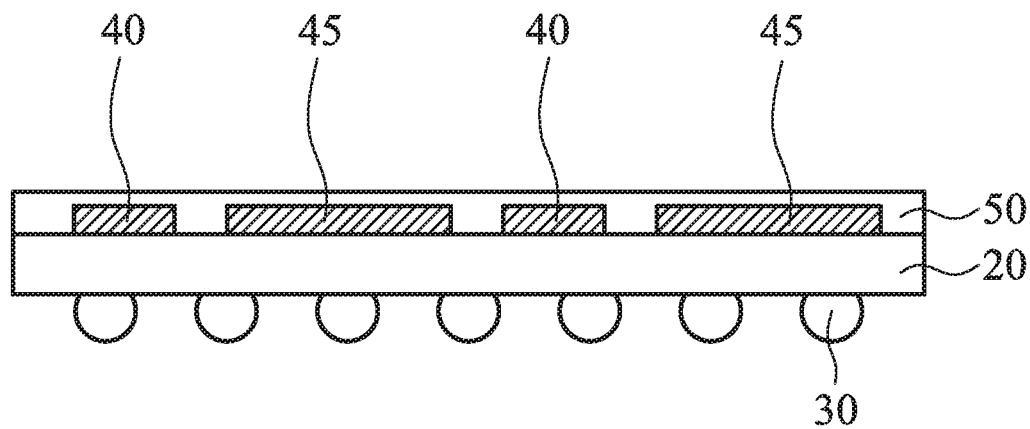
FIGS. 2-5 are cross-sectional side views of a portion of a bump-on-trace structure at various stages of fabrication in accordance with various embodiments of the present disclosure.

FIG. 2 is a cross-sectional view of a bump-on-trace package structure according to one embodiment of the present disclosure. The bump-on-trace package structure includes a first package component 20. First package component 20 may be a package substrate, and hence is alternatively referred to as package substrate 20 hereinafter. Alternatively, first package component 20 may be a semiconductor substrate such as a silicon substrate, although it may include other semiconductor materials, a wafer, an interposer, or other type of package component. A plurality of balls 30 attached to a bottom surface of the package substrate 20 may form a ball grid array (BGA) for connection to another package component.

Metal traces 40 are formed on a surface of package substrate 20. Metal traces 40 may be for expanding the footprint of a die. The width or diameter of the trace may be about the same as a solder ball (or solder bump) diameter, or can be as much as two to four times narrower than the solder ball (or solder bump) diameter. For example, metal trace 40 may have a line width between about mum and 40 μm and trace pitch P between about 30 μm and 70 μm. The metal trace 40 may have a tapered shape and be in the shape of a straight line, a bent line, or a curved line. A terminal of metal trace 40 may be of a different shape from the body of the metal trace. The metal trace body may be of a substantially constant thickness. Metal trace 40 may have a substantially longer length than the diameter of a solder ball (or solder bump). FIG. 2 also shows neighboring metal traces 45 formed next to or adjacent to metal trace 40. The space between metal trace 40 and neighboring metal trace 45 may be between about mum and 40 µm. There may be multiple metal traces 40 and 45 on package substrate 20.

Metal traces 40 and 45 may comprise conductive materials such as copper, copper alloy, aluminum, aluminum alloy, or other conductive materials such as tungsten, tungsten, nickel, palladium, gold, metal silicides, and/or alloys thereof.

A solder flux (not shown) may be applied to metal traces 40 and 45. The flux serves primarily to aid the flow of solder, such that a later formed solder bump (or solder ball) makes electrical contact with the metal traces 40 on the package substrate sufficient to reliably conduct electricity between the metal trace and the solder bump. The solder flux may be applied in any of a variety of methods, including brushing or spraying.

Still referring to FIG. 2, the bump-on-trace package structure includes a dielectric mask layer 50 that is formed on a top surface of the package substrate 20, the metal trace 40 and neighboring metal trace 45. Dielectric mask layer 50 may be a solder mask layer, and hence is alternatively referred to as solder mask layer 50 hereinafter. Solder mask layer 50 may perform several functions, including providing electrical insulation between the metal traces on the substrate, chemical and corrosion resistance or protection, mechanical support for the bump-on-trace structures, and improved dielectric reliability. As will be explained below, solder mask layer 50 also prevents solder bumps 90 (shown in FIG. 4) from bridging to a neighboring metal trace 45 that may be the result of a metal bump shift or a mismatch in the coefficient of thermal expansion (CTE) between the package substrate 20 and another package component such as device die 70 (See FIG. 4), for example.

Solder mask layer 50 may be formed at a single step, by screening a wet film onto the surface of package substrate 20 and then curing the wet film by oven baking. The thickness of the solder mask layer 50 may be about 30 to 40 microns (typically around 35 microns). Solder mask layer 50 may comprise a polymer, epoxy, and/or dielectric material that do not react with solder.

Figure 3:
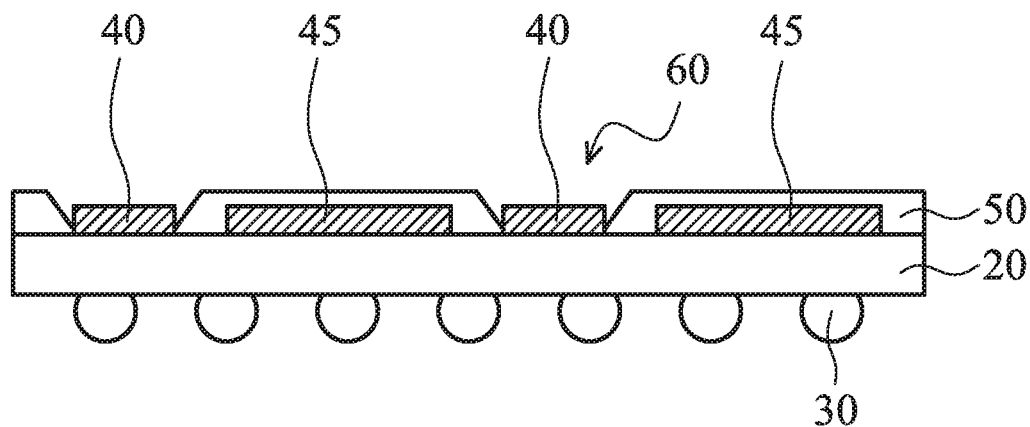
Figure 4:
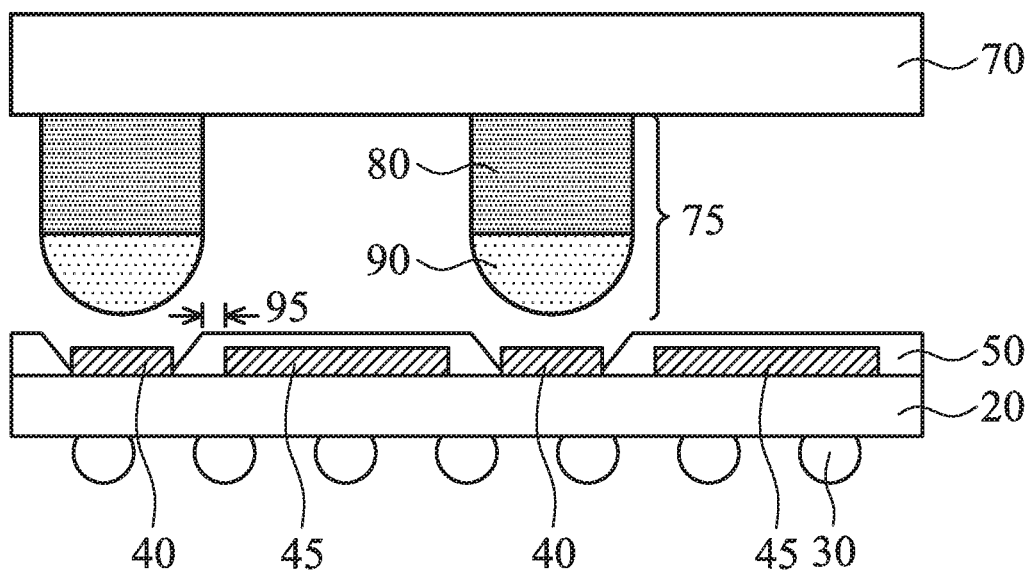

Openings may be formed in the solder mask layer to expose select metal traces for bonding to an interconnect such as solder bumps 90 (see FIG. 4). According to one embodiment as shown in FIG. 3, openings 60 are formed in the solder mask layer 50 to expose metal traces 40 but neighboring metal traces 45 are not exposed. It is understood that any number and/or combination of openings can be formed in the solder mask layer through which respective metal traces are exposed. In one embodiment, solder mask layer 50 is constructed of a photodefinable material, and is patterned by photoresist patterning techniques to form openings 60. In some embodiments, openings 60 are formed by laser drilling the solder mask layer 50. Opening 60 may be large enough so that an interconnect such as solder bump 90 may directly land on metal trace 40 contained in the opening. For example, opening 60 has a size substantially equal to a diameter of a solder bump 90. A wider opening to host solder bump 90 can increase the connection strength between the solder bump and the trace. The size of the opening is flexible and may change with the size of the solder bump used to connect to the respective metal trace.

With reference now to FIG. 4, the bump-on-trace package structure includes a second package component 70, whereby the first package component 20 is bonded to the second package component 70 through solder bumps 90. Second package component 70 may be a device die that includes active devices therein, and hence is alternatively referred to as device die 70 hereinafter. Device die 70 may be a memory die, or any other functional die. Alternatively, first package component 20 may be a substrate, a wafer, an interposer, or other type of package component.

Device die 70 is flipped to face package substrate 20 for connection to package substrate 20 by a plurality of interconnects 75. Each of the plurality of interconnects 75 comprises a metal bump 80 and a solder bump 90, in at least one embodiment. In other embodiments, interconnects 75 comprise other connectors. Interconnects 75 may be formed in a variety of shapes, such as in the shape of a circle, an octagon, a rectangle, an elongated hexagon with two trapezoids on opposite ends of the elongated hexagon, an oval, a diamond, or the like.

Metal bump 80 may comprise a copper pillar bump. However, the pillar bump material should not be limited to copper only. Examples of other materials suitable for the metal bump 80 include aluminum, aluminum/silicon/copper alloy, titanium, titanium nitride, tungsten, polysilicon, metal silicide (such as nickel silicide, cobalt silicide, tungsten silicide, tantalum silicide, titanium silicide, platinum silicide, palladium silicide, or combinations thereof), copper, copper alloy, titanium, titanium nitride, tantalum, tantalum nitride, tungsten, polysilicon, and combinations thereof.

Figure 5:
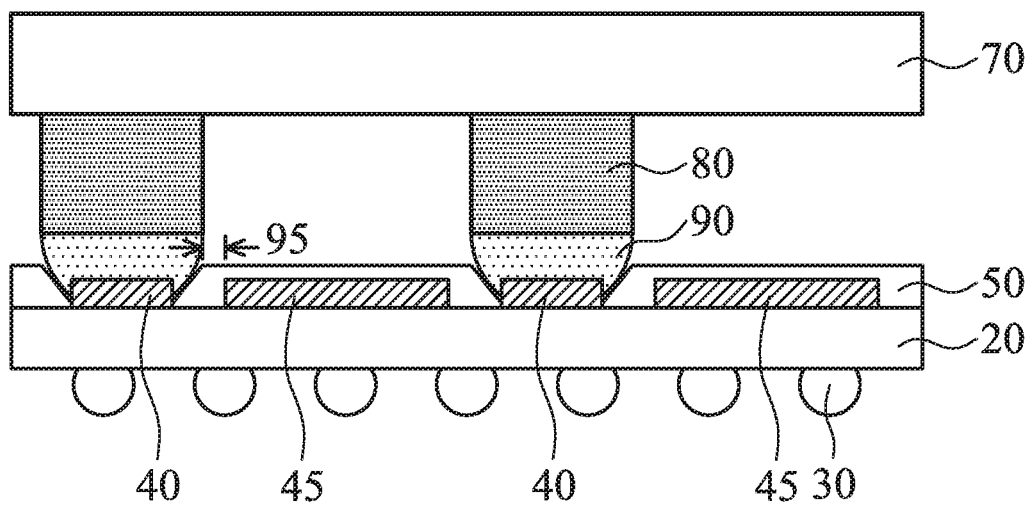

As shown in FIG. 5, metal bump 80 is positioned to overlay metal trace 40 (with a minimum bump to trace distance 95 to a side of neighboring metal trace 45) on package substrate 20, to allow solder bump 90 contacting metal trace 40 in opening 60 to form a bump-on-trace connection. In at least one embodiment, solder bump 90 may be formed on metal bump 80, for example, by plating a solder layer on top of metal bump 80, and then applying heat to reflow the solder layer. In at least one embodiment, the heat may be to a temperature of about 220 C. The solder layer may contain lead, or be lead-free. Examples of solder materials include tin, copper, silver, bismuth, indium, zinc, antimony, Sn—Ag—Cu, Ag—Cu—Zn and Sn—Ag—Cu—Mn, and alloys with traces of other metals. In at least one embodiment in which solder bump 90 is a tin solder bump, the solder bump 90 may be formed by initially forming a layer of tin through methods such as evaporation, electroplating, printing, solder transfer, or ball placement, to a thickness of, e.g., about 15 µm, and then performing a reflow in order to shape the material into a desired bump shape. Any suitable method of producing the solder bump 90 may alternatively be utilized.

Referring back to FIG. 4, a gap 95 between the metal bump 80 and the neighboring trace 45 is the minimum bump-to-trace distance sufficient to provide short circuit protection. However, solder bump bridging to a neighboring metal trace frequently happens at the minimum bump to trace location. Solder mask layer 50 confines solder bump 90 in opening 60 for contact to metal trace 40 and prevents solder bump 90 from contacting a neighboring metal trace, such as neighboring metal trace 45. Opening 60 also defines a contour of the melted solder at metal trace 40 and the solder flow is limited by the solder mask layer 50, for example by the width of the opening 60 in solder mask layer 50.

After the bonding of the device die 70 to the package substrate 20, an underfill (e.g., a thermo-set epoxy) or a mold underfill (MUF) (not shown) may be dispensed in the space between package substrate 20 and device die 70 and may contact metal traces 40 and 45. The underfill produces a mechanically, as well as electrically, bonded semiconductor chip assembly.

The bump-on-trace package structures shown in FIGS. 2-5 are only for illustrative purpose and are not limiting. Additional embodiments can be conceived.

Advantages of one or more embodiments of the present disclosure may include one or more of the following.

In one or more embodiments, the solder mask layer prevents solder bumps from bridging to a neighboring metal trace at the minimum bump to trace location that may be the result of a metal bump shift or a mismatch in the coefficient of thermal expansion (CTE) between a first package component and a second package component.

In one or more embodiments, the bump-on-trace structure reduces the risk of solder bridging.

In one or more embodiments, fine pitch metal bumps can be achieved in bump-on-trace package structures.

In one or more embodiments, the solder mask layer provides for electrical insulation between the metal traces on the substrate, chemical and corrosion resistance or protection, mechanical support for the bump-on-trace structures, and improved dielectric reliability.

The present disclosure has described various exemplary embodiments.

According to one embodiment, a device includes a first package component. A first metal trace and a second metal trace are formed on a surface of the first package component. A dielectric mask layer covers a top surface of the first package component, the first metal trace and the second metal trace, wherein the dielectric mask layer has an opening therein that exposes the first metal trace. The device further includes a second package component and an interconnect formed on the second package component. The interconnect includes a metal bump and a solder bump, the solder bump is formed on the metal bump. The solder bump contacts the first metal trace in the opening of the dielectric mask layer.

According to another embodiment, a bump-on-trace package structure includes a first package component. A first metal trace and a second metal trace are formed on a surface of the first package component. A solder mask layer covers a top surface of the first package component, the first metal trace and the second metal trace, wherein the solder mask layer has an opening therein exposing the first metal trace. The bump-on-trace package structure further includes a second package component disposed over the first package component. The second package component includes an interconnect having a copper pillar bump and a solder bump, the solder bump bonded to the copper pillar bump. The solder bump contacts the first metal trace in the opening of the dielectric mask layer.

According to yet another embodiment, a method for manufacturing a device, includes providing a first package component having a first metal trace and a second metal trace formed on a surface of the first package component. A solder mask layer is formed to cover a top surface of the first package component, the first metal trace and the second metal trace. An opening is formed in the solder mask layer to expose the first metal trace. A second package component is disposed over the first package component, wherein the second package component includes an interconnect having a metal bump and a solder bump, the solder bump bonded to the metal bump. The solder bump is contacted to the first metal trace in the opening of the solder mask layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims

What is claimed is:

1. A method for manufacturing a device, comprising:
   forming a solder mask layer to cover a top surface of a first package component, a first metal trace, and a second metal trace, the first metal trace and the second metal trace are formed on the top surface of the first package component, the solder mask layer insulates the first metal trace from the second metal trace;
   patterning an opening in the solder mask layer to expose the first metal trace without exposing the second metal trace, wherein patterning the opening in the solder mask layer comprises performing a photolithography process on the solder mask layer;
   after patterning the opening the solder mask layer, disposing a second package component over the first package component, wherein the second package component comprising an interconnect, the interconnect comprising a metal bump and a solder bump on the metal bump; and
   bonding the solder bump to the first metal trace in the opening of the solder mask layer.

2. The method of claim 1, wherein patterning the opening in the solder mask layer comprises laser drilling the solder mask layer.

3. The method of claim 1, further comprising:
   plating a solder layer on top of the metal bump; and
   reflowing the solder layer to provide the solder bump on the metal bump.

4. The method of claim 1, wherein bonding the solder bump to the first metal trace comprises reflowing the solder bump to contact the first metal trace, wherein the solder mask layer confines at least a portion of the solder bump in the opening during reflowing the solder bump.

5. The method of claim 1, wherein bonding the solder bump to the first metal trace comprises contacting the solder bump with a first portion of a side surface of the first metal trace.

6. The method of claim 5, wherein the solder mask layer contacts a second portion of the side surface of the first metal trace, the second portion of the side surface of the first metal trace being below the first portion of the side surface of the first metal trace, and the side surface of the first metal trace extending continuously from the first portion of the side surface of the first metal trace to the second portion of the side surface of the first metal trace.

7. The method of claim 1 further comprising after bonding the solder bump to the first metal trace, forming an underfill between the first package component and the second package component.

8. The method of claim 7, wherein the underfill contacts the first metal trace.

9. A method comprising:
   forming a solder mask over a first metal trace and a second metal trace of a first package component, wherein the solder mask insulates the first metal trace from the second metal trace;
   patterning the solder mask by performing a photolithographic process on the solder mask to expose the first metal trace without exposing the second metal trace in a cross-sectional view, wherein after patterning the solder mask, the solder mask contacts a side surface of the first metal trace at a first point; and bonding second package component to the first package component by bonding an solder region to the first metal trace, wherein after the bonding, the solder region contacts the side surface of the first metal trace at a second point higher than the first point, wherein a portion of the side surface of the first metal trace extends continuously from the first point to the second point.

10. The method of claim 9, wherein the portion of the side surface of the first metal trace is orthogonal to a top surface of the solder mask.

11. The method of claim 9 further comprising dispensing an underfill between the first package component and the second package component after bonding the second package component to the first package component.

12. The method of claim 9, wherein the solder region is formed on a metal bump of the second package component.

13. The method of claim 9, the first package component is a package substrate and the second package component is a device die.

14. The method of claim 9, wherein a width or a diameter of the first metal trace is the same as a diameter of the solder region.

15. A method comprising:
forming a first metal trace and a second metal trace on a top surface of a first package component, the first metal trace having a first thickness with respect to the top surface of the first package component and the second metal trace having a second thickness with respect to the top surface of the first package component, the first thickness and the second thickness being equal;
covering a top surface of the first package component and the second metal trace with a dielectric mask layer;
patterning an opening in the dielectric mask layer exposing the first metal trace but not the second metal trace, and the dielectric mask layer has constantly sloped sidewall surfaces defining the opening, the dielectric mask layer being a photodefinable layer, patterning the opening in the dielectric mask layer comprises performing a photolithographic process on the dielectric mask layer, the dielectric mask layer forming a first interface with a side surface of the first metal trace after patterning the opening; and
bonding a second package component to the first package component, an interconnect of the second package component comprises a metal bump and a solder bump formed on the metal bump, the solder bump forming a second interface with the side surface of the first metal trace, the side surface of the first metal trace extending continuously from the first interface to the second interface.

16. The method of claim 15, wherein the opening in the dielectric mask layer has a diameter greater than or equal to a diameter of the solder bump.

17. The method of claim 15, wherein the first metal trace is separated from the second metal trace by a space of 10 micrometers to 40 micrometers, and the constantly sloped sidewall surfaces of the dielectric mask layer is sloped at an angle with respect to the top surface of the first package component such that the dielectric mask layer is configured to preserve a minimum spacing between the solder bump and the second metal trace.

18. The method of claim 15, wherein bonding the second package component to the first package component comprises contacting the solder bump to the constantly sloped sidewall surfaces of the dielectric mask layer.

19. The method of claim 1, wherein patterning the opening in the solder mask layer comprises patterning the opening with sloped sidewall surfaces.

20. The method of claim 19, wherein the solder bump contacts the sloped sidewall surfaces of the opening.

* * * * *